United States Patent
Toya

(10) Patent No.: US 10,749,362 B2
(45) Date of Patent: Aug. 18, 2020

(54) METHOD FOR SERVER APPARATUS TO DETECT ABNORMALITY IN ELECTRICAL-POWER STORAGE DEVICE

(71) Applicant: Panasonic Intellectual Property Management Co., Ltd., Osaka (JP)

(72) Inventor: Shoichi Toya, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/221,689

(22) Filed: Jul. 28, 2016

(65) Prior Publication Data
US 2017/0059665 A1  Mar. 2, 2017

(30) Foreign Application Priority Data
Aug. 28, 2015  (JP) .................. 2015-168651

(51) Int. Cl.
*H02J 7/00* (2006.01)
*G01R 31/392* (2019.01)

(52) U.S. Cl.
CPC .......... *H02J 7/0047* (2013.01); *G01R 31/392* (2019.01); *H02J 7/0048* (2020.01)

(58) Field of Classification Search
CPC .... B60R 16/033; G01R 31/40; G01R 31/362; G01R 31/3624; G01R 31/3662;
(Continued)

(56) References Cited

U.S. PATENT DOCUMENTS

| | | | | |
|---|---|---|---|---|
| 5,773,977 A | * | 6/1998 | Dougherty | .......... G01R 31/362 |
| | | | | 324/427 |
| 2003/0137277 A1 | | 7/2003 | Mori et al. | |

(Continued)

FOREIGN PATENT DOCUMENTS

| | | |
|---|---|---|
| EP | 1293377 A2 | 3/2003 |
| JP | 2001-306961 | 11/2001 |

(Continued)

OTHER PUBLICATIONS

English Translation of Chinese Search Report dated Apr. 2, 2020 for the related Chinese Patent Application No. 201610640894.X.

*Primary Examiner* — Son T Le
*Assistant Examiner* — Dustin R Dickinson
(74) *Attorney, Agent, or Firm* — Greenblum & Bernstein, P.L.C.

(57) ABSTRACT

A server apparatus obtains, via an information terminal wirelessly connected to an electrical-power storage device, a value indicating a state of the electrical-power storage device at an end of use of electric equipment having the electrical-power storage device. The server apparatus further obtains, via the information terminal wirelessly connected with the electrical-power storage device, a value indicating the state of the electrical-power storage device at a start of the use of the electric equipment. The server apparatus then detects an abnormality in the electrical-power storage device by using the value indicating the state of the electrical-power storage device at the end of the use and the value indicating the state of the electrical-power storage device at the start of the use.

12 Claims, 11 Drawing Sheets

(58) Field of Classification Search
CPC ........... G01R 31/3679; G01R 19/16542; H02J 7/0047; H02J 2007/005; H02J 2007/0096; H02J 2007/0098
See application file for complete search history.

(56) References Cited

U.S. PATENT DOCUMENTS

| | | | |
|---|---|---|---|
| 2008/0036421 A1* | 2/2008 | Seo | B60K 6/28 320/132 |
| 2010/0045298 A1* | 2/2010 | Iwane | G01R 31/3624 324/427 |
| 2010/0280776 A1* | 11/2010 | Hayakawa | G01R 31/392 702/63 |
| 2011/0184677 A1* | 7/2011 | Tae | G01R 31/396 702/63 |
| 2012/0175953 A1 | 7/2012 | Ohkawa et al. | |
| 2013/0179061 A1* | 7/2013 | Gadh | B60L 11/1842 701/123 |
| 2014/0197843 A1* | 7/2014 | Schurman | G01R 31/025 324/509 |
| 2015/0241515 A1* | 8/2015 | Gross | G01R 31/362 702/63 |
| 2015/0346283 A1* | 12/2015 | Kwon | G01R 27/08 702/63 |
| 2015/0346285 A1* | 12/2015 | Igarashi | G01R 31/361 324/432 |
| 2016/0363630 A1* | 12/2016 | Laskowsky | G01R 31/3606 |

FOREIGN PATENT DOCUMENTS

| | | |
|---|---|---|
| JP | 2002-058102 A | 2/2002 |
| JP | 2013-074707 A | 4/2013 |
| JP | 2014-197542 A | 10/2014 |

\* cited by examiner

FIG. 4

| BATTERY-USE HISTORY INFORMATION | | | | |
|---|---|---|---|---|
| BATTERY STATE INFORMATION | | USER ID | DATE AND TIME | FLAG |
| BATTERY ID | REMAINING BATTERY CAPACITY [Wh] | | | |
| ⋮ | ⋮ | ⋮ | ⋮ | ⋮ |
| 14194 | 8000 | 3894 | 07-01-2015 08:15 | STARTED |
| 14194 | 7500 | 3894 | 07-01-2015 08:25 | CONTINUED |
| 14194 | 7000 | 3894 | 07-01-2015 08:35 | CONTINUED |
| 14194 | 6500 | 3894 | 07-01-2015 08:45 | ENDED |
| 14194 | 6200 | 3894 | 07-01-2015 18:19 | STARTED |

FIG. 5

| BATTERY MANAGEMENT INFORMATION | | | | |
|---|---|---|---|---|
| BATTERY ID | REMAINING BATTERY CAPACITY [Wh] | USER ID | DATE AND TIME | FLAG |
| ⋮ | ⋮ | ⋮ | ⋮ | ⋮ |
| 14194 | 7000 | 3894 | 07-01-2015 08:35 | CONTINUED |
| 14194 | 6500 | 3894 | 07-01-2015 08:45 | ENDED |
| 14194 | 6200 | 3894 | 07-01-2015 18:19 | STARTED |
| ⋮ | ⋮ | ⋮ | ⋮ | ⋮ |
| 48317 | 7500 | 54902 | 07-03-2015 19:45 | ENDED |
| 48317 | 1500 | 54902 | 07-04-2015 07:53 | STARTED |
| ⋮ | ⋮ | ⋮ | ⋮ | ⋮ |

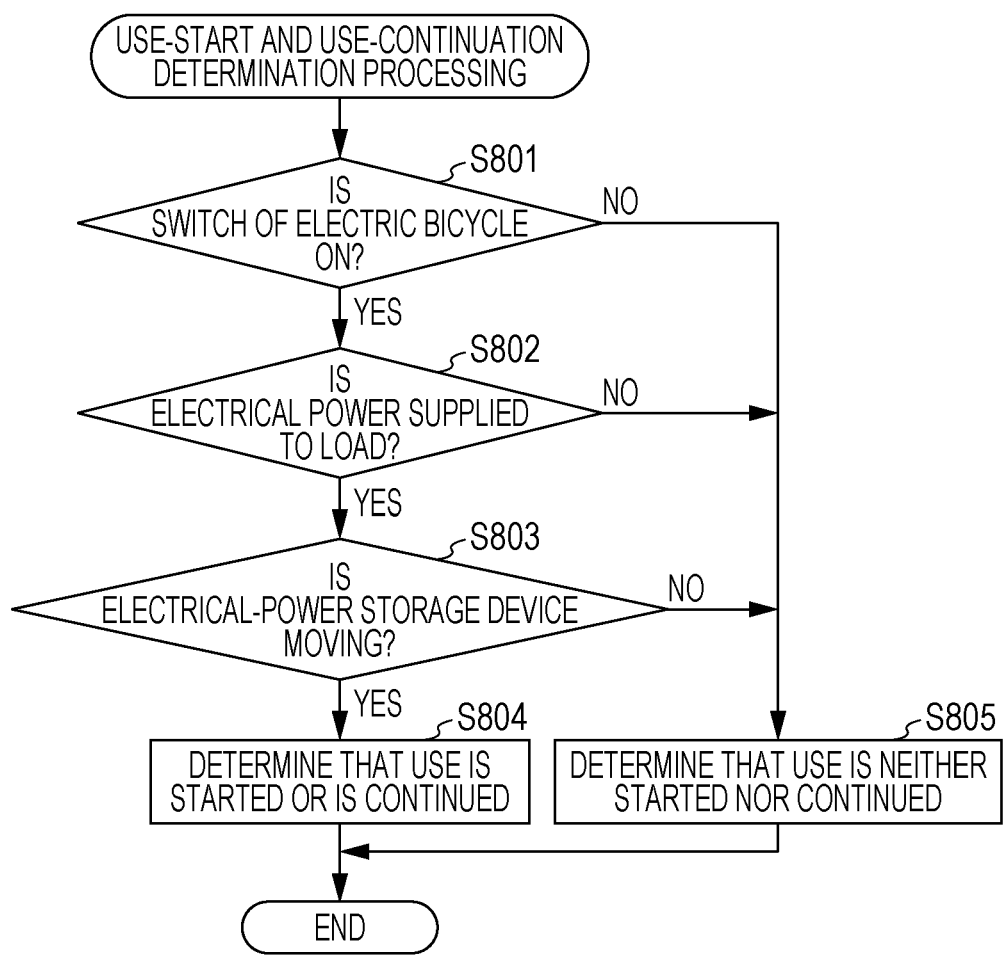

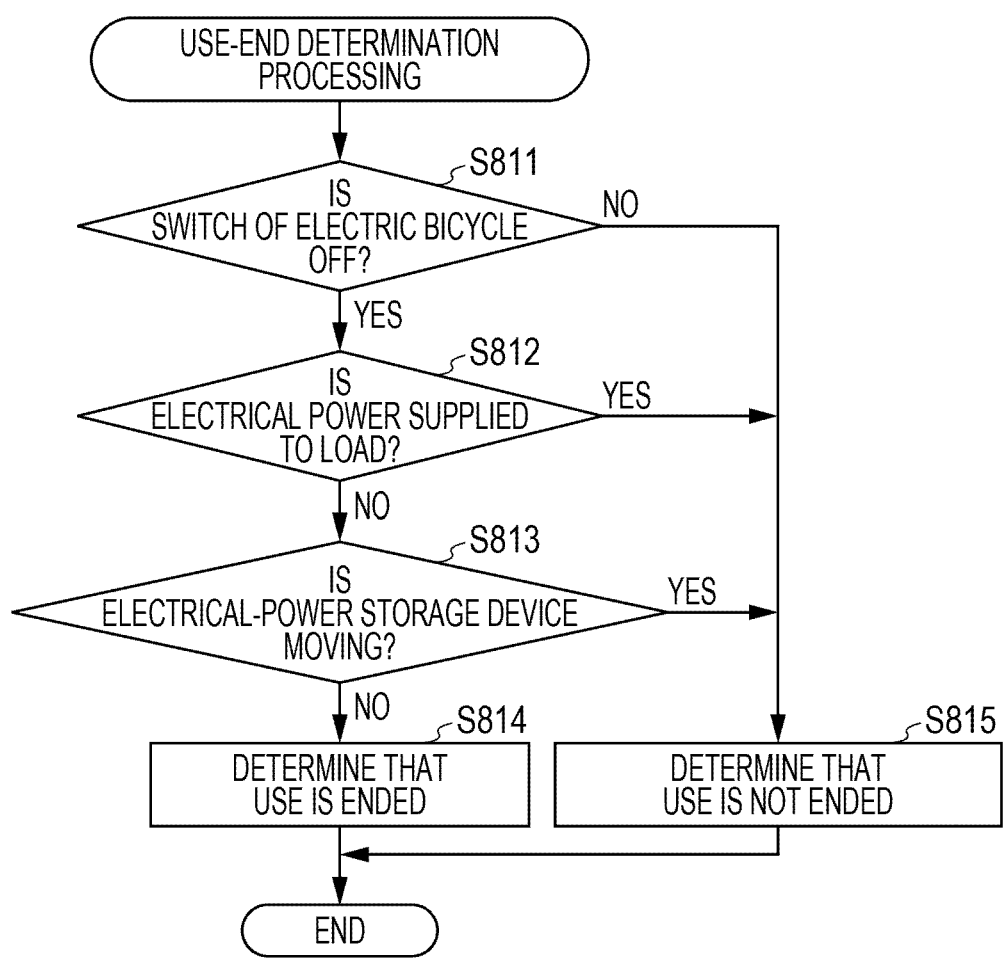

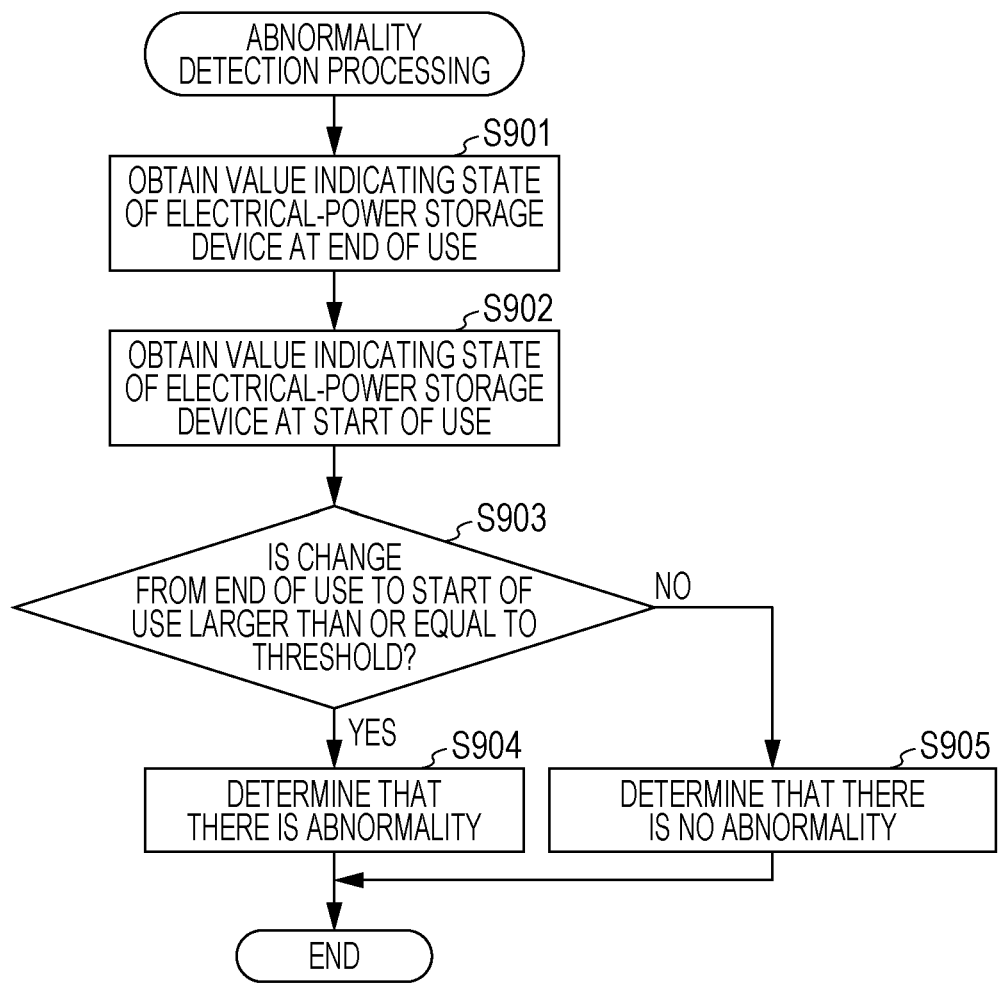

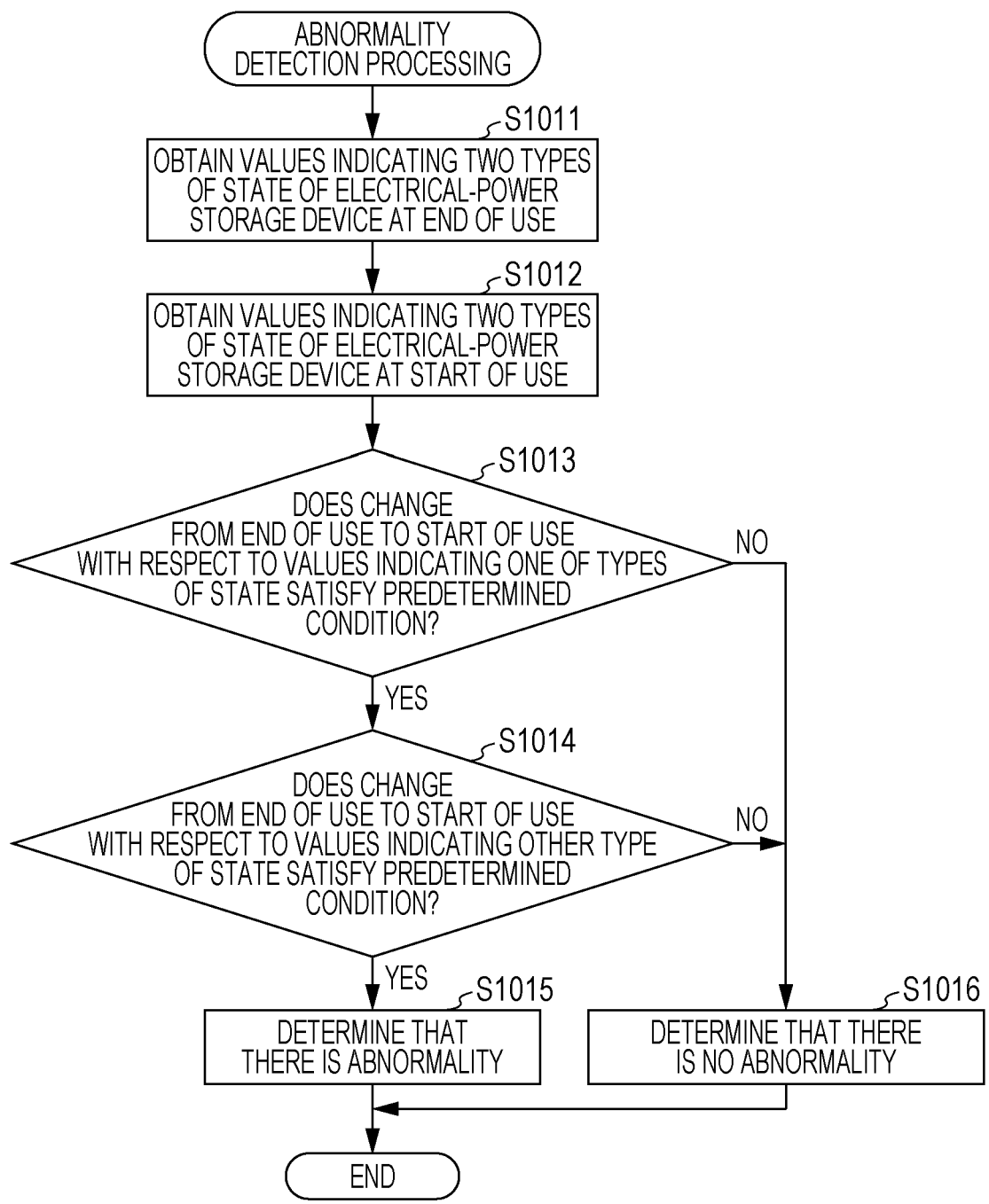

METHOD FOR SERVER APPARATUS TO DETECT ABNORMALITY IN ELECTRICAL-POWER STORAGE DEVICE

BACKGROUND

1. Technical Field

The present disclosure relates to a method for a server apparatus to detect an abnormality in an electrical-power storage device.

2. Description of the Related Art

In recent years, electric equipment, such as mobile phone terminals and electric bicycles, equipped with electrical-power storage devices has come into widespread use. A rental system of an electrical-power storage device included in such electric equipment is disclosed in Japanese Unexamined Patent Application Publication No. 2001-306961 (hereinafter referred to as "Patent Document 1").

Electrical-power storage devices deteriorate by repeating charging and discharging, and there is a possibility that the deterioration is promoted even in a stop period in which the electrical-power storage devices are not executing charging or discharging.

In Patent Document 1, the degree of deterioration of the electrical-power storage device is measured based on a charging count or a battery capacity when it is fully charged.

SUMMARY

One non-limiting and exemplary embodiment provides an abnormality detection method for detecting an abnormality that appears as a sign or a result of deterioration of an electrical-power storage device by using a method different from methods of related art.

In one general aspect, the techniques disclosed here feature an abnormality detection method. The method includes: obtaining, via an information terminal wirelessly connected to an electrical-power storage device, a value indicating a state of the electrical-power storage device at an end of use of electric equipment having the electrical-power storage device; obtaining, via the information terminal, a value indicating the state of the electrical-power storage device at a start of the use of the electric equipment; and detecting an abnormality in the electrical-power storage device by using the value indicating the state of the electrical-power storage device at the end of the use and the value indicating the state of the electrical-power storage device at the start of the use.

According to the configuration described above, an abnormality in the electrical-power storage device in a use stop period from the end of the use of the electric equipment until the start of the use thereof can be detected using the value indicating the state of the electrical-power storage device at the end of the use of the electric equipment and the value indicating the state of the electrical-power storage device at the start of the use of the electric equipment.

It should be noted that general or specific embodiments may be implemented using a system, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 4 illustrates one example of battery-use history information;

FIG. 5 illustrates one example of battery management information;

FIGS. 8A and 8B are flowcharts illustrating examples of use-start determination processing, use-continuation determination processing, and use-end determination processing executed by an electrical-power storage device;

FIG. 9 is a flowchart illustrating one example of abnormality detection processing for the electrical-power storage device; and FIGS. 10A and 10B are flowcharts illustrating modifications of the abnormality detection processing for the electrical-power storage device.

DETAILED DESCRIPTION

The embodiment described below represents a specific example of the present disclosure. Numerical values, shapes, constituent elements, steps, the order of steps, and so on described in the embodiment below are examples, and are not intended to limit the present disclosure.

A battery management system according to one embodiment will be described below with reference to the accompanying drawings.

<1. Configuration>

Figure 1:
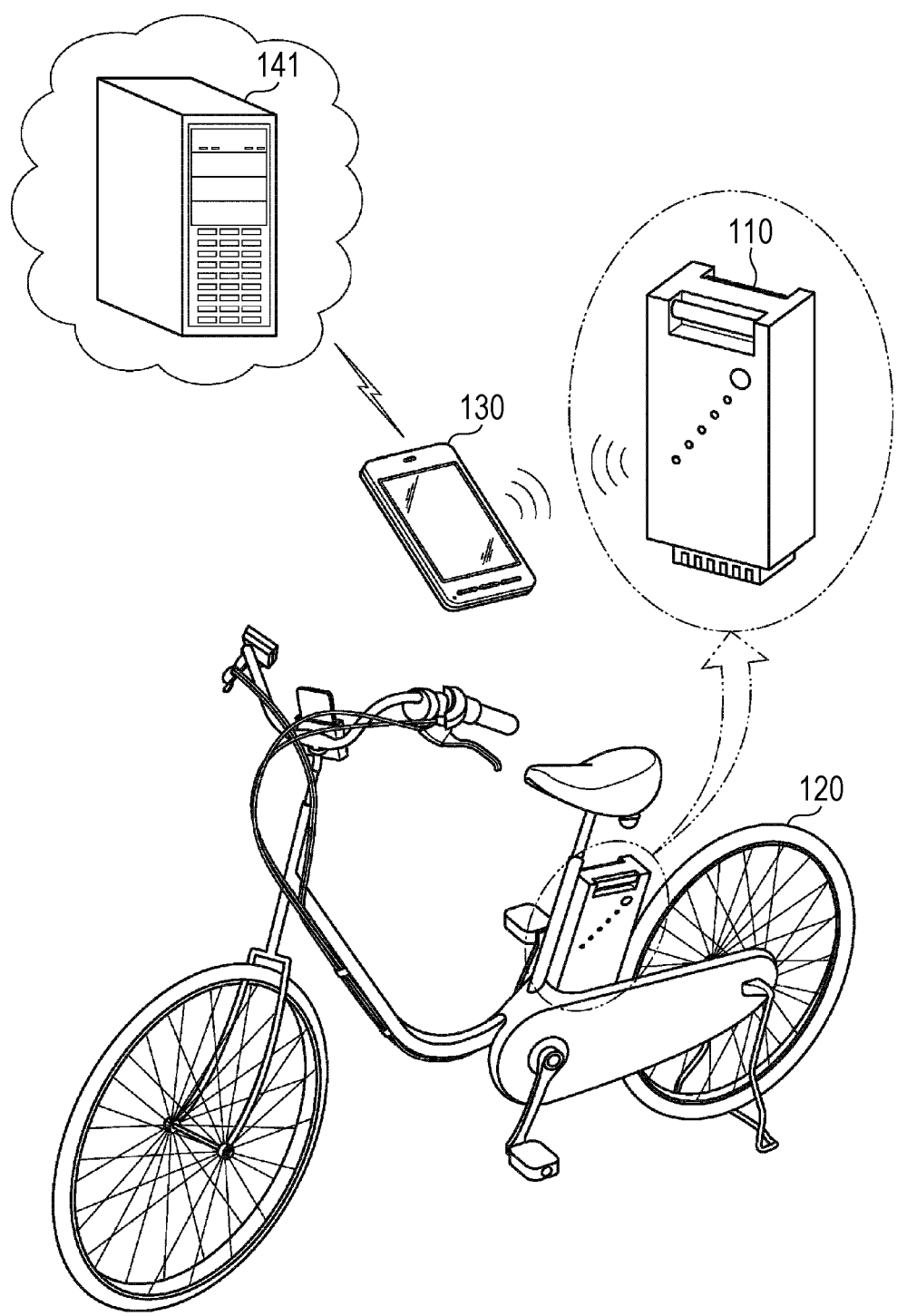
FIG. 1 is an overall schematic view of the configuration of a battery management system.

FIG. 1 is an overall schematic view of the configuration of the battery management system. The battery management system includes an electrical-power storage device 110, an electric bicycle 120 having the electrical-power storage device 110, an information terminal 130, and a server in a battery management center 140.

The electric bicycle 120 has a power-assist function for assisting human power by operating a motor using the electrical-power storage device 110 as a power source. The electric bicycle 120 and the electrical-power storage device 110 have terminals. The electrical-power storage device 110 is fixed to the electric bicycle 120 so that the terminals of both the electric bicycle 120 and the electrical-power storage device 110 contact each other, and electrical power is supplied from the electrical-power storage device 110 to the electric bicycle 120 via the terminals that contact each other.

The information terminal 130 is, for example, a portable information terminal, such as a smartphone, and transmits/receives data to/from the electrical-power storage device 110 by using short-range wireless communication, such as Bluetooth (registered trademark) communication. The information terminal 130 also connects to the Internet through a mobile-phone channel or the like to transmit/receive data to/from the server in the battery management center 140 over the Internet.

Figure 2:
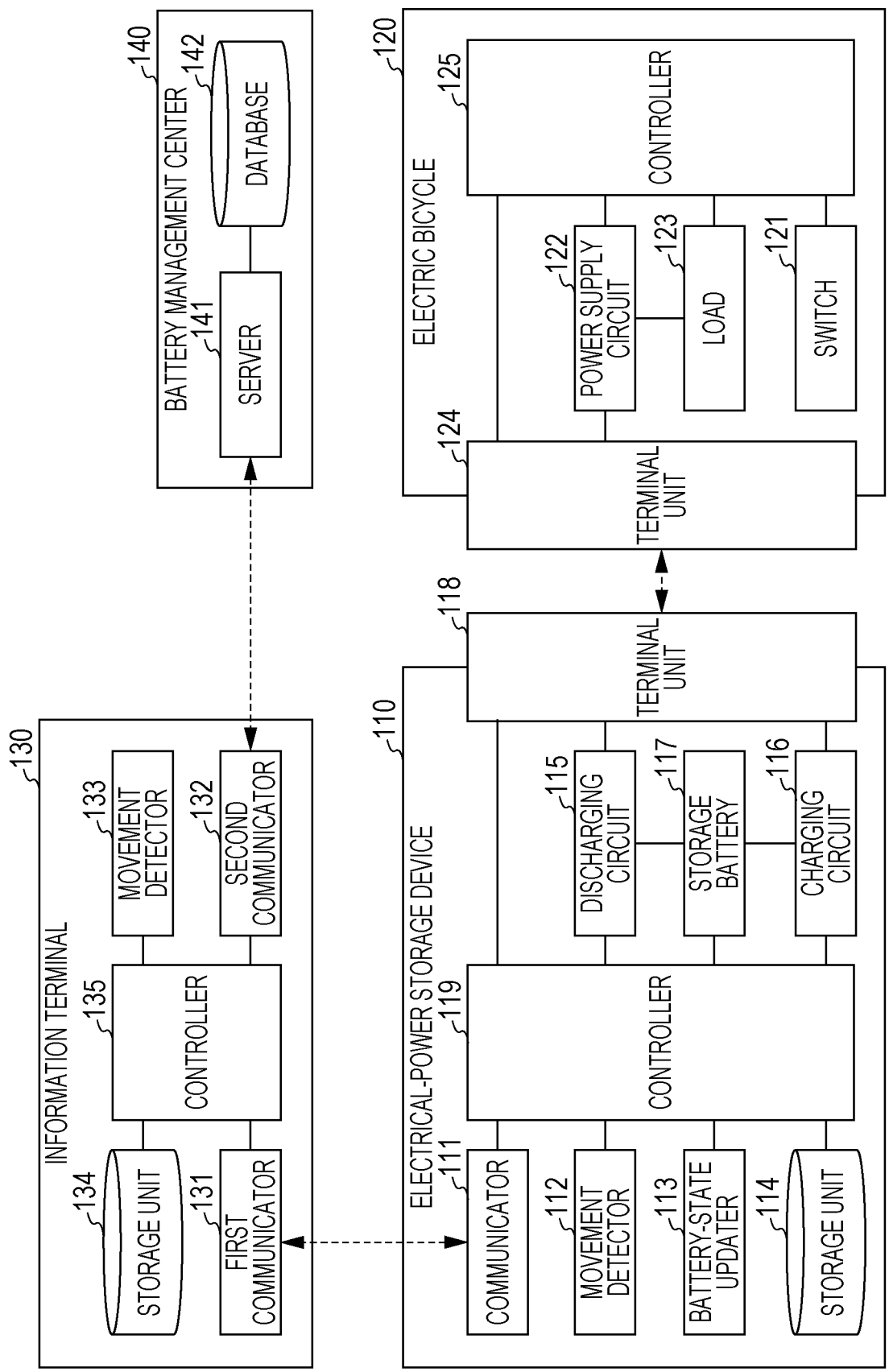
FIG. 2A is a functional block diagram of the battery management system.
FIG. 2B is a functional block diagram of a battery management center.

FIG. 2A is a functional block diagram of the battery management system. The functional configurations of the electrical-power storage device 110, the electric bicycle 120, the information terminal 130, and the battery management center 140 will be described with reference to FIG. 2A.

<1-1. Electrical-Power Storage Device 110>

The electrical-power storage device 110 includes a communicator 111, a movement detector 112, a battery-state updater 113, a storage unit 114, a discharging circuit 115, a charging circuit 116, a storage battery 117, a terminal unit 118, and a controller 119.

The communicator 111 is implemented using a chipset for wireless communication based on a predetermined short-range wireless communication standard and has a function for performing short-range wireless communication with the information terminal 130. Setting information for connecting to the information terminal 130, which is paired with the electrical-power storage device 110, is stored in the storage unit 114. When the paired information terminal 130 is present in a range in which communication is possible, the communicator 111 automatically connects to the information terminal 130 by using the setting information stored in the storage unit 114.

The movement detector 112 is implemented using, for example, an acceleration sensor and has a function for sensing movement of the electrical-power storage device 110 by using a predetermined algorithm to process a signal output from the acceleration sensor.

The battery-state updater 113 has a function for measuring values indicating the state of the storage battery 117 and updating battery state information stored in the storage unit 114 by using the measured value.

The storage unit 114 is implemented using a volatile or nonvolatile storage device and stores therein battery state information and the above-described setting information for connecting to the information terminal 130 through the short-range wireless communication.

The terminal unit 118 includes a discharging terminal pair for supplying electrical power to the electric equipment that uses the electrical-power storage device 110 as a power source, a charging terminal pair for receiving electrical power from a battery charger for charging the storage battery 117, and a communication terminal for communicating with the electric equipment.

The discharging circuit 115 is a circuit for controlling discharging of the storage battery 117 and has a function for outputting electrical power, accumulated in the storage battery 117, via the discharging terminal pair in the terminal unit 118 at a specified discharging current value and a specified discharging voltage value.

The charging circuit 116 is a circuit for controlling charging of the storage battery 117 and has a function for charging the storage battery 117 with electrical power, input via the charging terminal pair in the terminal unit 118 at a specified charging current value and a specified charging voltage value.

The storage battery 117 is, for example, a lithium-ion battery and executes discharging and charging under the control of the discharging circuit 115 and the charging circuit 116.

The electrical-power storage device 110 obtains, for example, an electrical power value requested by the electric equipment through communication via the communication terminal and determines the discharging current value, the discharging voltage value, and so on. The electrical-power storage device 110 may communicate with the battery charger via the communication terminal. The discharging terminal pair and the charging terminal pair do not necessarily have to be different from each other and may be the same terminal pair. The electrical-power storage device 110 is detachably connected to the electric equipment via a connection unit (not illustrated). The terminal unit 118 is provided in the connection unit, and the electrical-power storage device 110 is electrically connected to the electric equipment via the connection unit.

The controller 119 is implemented using a processor and a memory that holds a control program therein. The controller 119 has a function for controlling the individual elements in the electrical-power storage device 110 through execution of the control program by the processor.

Although not illustrated, the electrical-power storage device 110 has, for example, reporting means, such as a lamp or a speaker, and can report the state of the electrical-power storage device 110 to a user.

<1-2. Electric Bicycle 120>

The electric bicycle 120 has a switch 121, a power supply circuit 122, a load 123, a terminal unit 124, and a controller 125.

The switch 121 is a switch for enabling the power-assist function of the electric bicycle 120. When the user pedals the electric bicycle 120 with the switch 121 turned on, electrical power is supplied from the electrical-power storage device 110 to the load 123.

The terminal unit 124 includes a power reception terminal pair for receiving power from the electrical-power storage device 110 and a communication terminal for communicating with the electrical-power storage device 110.

The power supply circuit 122 is a circuit for controlling electrical-power supply to the load 123 and has a function for supplying electrical power, input from the electrical-power storage device 110 via the power reception terminal pair in the terminal unit 124, to the load 123 at a specified current value and a specified voltage value.

The load 123 is a motor in the electric bicycle 120. Under the control of the power supply circuit 122, the load 123 operates to generate power for assisting human power. On the basis of the users power applied to the pedals of the electric bicycle 120, the rotational speed of the tire(s), or the like, the electric bicycle 120 determines the power to be generated by the motor. The electric bicycle 120 transmits the state of the switch 121, an electrical power value needed by the load 123, and so on to the electrical-power storage device 110 through communication via the communication terminal.

The controller 125 is implemented using a processor and a memory that holds a control program therein. The controller 125 has a function for controlling the individual elements of the electric bicycle 120 through execution of the control program by the processor.

<1-3. Information Terminal 130>

The information terminal 130 includes a first communicator 131, a second communicator 132, a movement detector 133, a storage unit 134, and a controller 135.

The first communicator 131 is implemented using a chipset for wireless communication based on a predetermined short-range wireless communication standard and has a function for performing short-range wireless communication with the electrical-power storage device 110. Setting information for connecting to the paired electrical-power storage device 110 is stored in the storage unit 134. When the paired electrical-power storage device 110 is present in a range in which communication is possible, the first communicator 131 automatically connects to the electrical-power storage device 110 by using the setting information stored in the storage unit 134.

The second communicator 132 is implemented using a chipset for wireless communication based on a predetermined wireless communication standard and has a function for connecting to the Internet through a mobile-phone channel or the like. Setting information for accessing the server in the battery management center 140 is stored in the storage unit 134, and the second communicator 132 uses the setting information, stored in the storage unit 134, to connect to the server in the battery management center 140.

The movement detector 133 is implemented using, for example, an acceleration sensor and has a function for sensing movement of the information terminal 130 by using a predetermined algorithm to process a signal output from the acceleration sensor.

The storage unit 134 is implemented using a volatile or nonvolatile storage device and stores therein battery-use history information described below. The storage unit 134 also stores therein the above-described setting information for connecting to the electrical-power storage device 110 through the short-range wireless communication and the above-described setting information for accessing the battery management center 140.

The controller 135 is implemented using a processor and a memory that holds a control program. The controller 135 has a function for controlling the individual elements in the information terminal 130 through execution of the control program by the processor.

Although not illustrated, the information terminal 130 has, for example, presenting means, such as a display or a speaker, and can present information generated by the information terminal 130 and so on to the user.

<1-4. Battery Management Center 140>

The battery management center 140 has a server 141 and a database 142.

The server 141 executes communication with the information terminal 130 to transmit/receive data and updates a battery-management information database stored in the database 142 on the basis of obtained data.

The database 142 stores therein battery management information described below.

FIG. 2B is a functional block diagram of the battery management center 140. The server 141 in the battery management center 140 will now be described with reference to FIG. 2B. The server 141 includes a third communicator 143 and a controller 144.

The third communicator 143 obtains values indicating the state of the electrical-power storage device 110 via the information terminal 130. For example, the third communicator 143 obtains, via the information terminal 130 wirelessly connected to the electrical-power storage device 110, a value indicating the state of the electrical-power storage device 110 at the end of use of the electric bicycle 120 having the electrical-power storage device 110. The third communicator 143 also obtains, via the information terminal 130 wirelessly connected to the electrical-power storage device 110, a value indicating the state of the electrical-power storage device 110 at the start of the use of the electric bicycle 120 having the electrical-power storage device 110.

The third communicator 143 is a communicator that performs wireless or wired communication with the information terminal 130. When the third communicator 143 is a wireless communicator, examples thereof include a WiMAX® wireless communicator, an LTE® wireless communicator, and so on. The third communicator 143 is one example of an obtainer in the present disclosure.

The controller 144 detects an abnormality in the electrical-power storage device 110 by using the value indicating the state of the electrical-power storage device 110 at the end of the use and the value indicating the state of the electrical-power storage device 110 at the start of the use, the values being obtained by the third communicator 143. The controller 144 is one example of an abnormality detector in the present disclosure.

The description thus far has been given of the configuration of the battery management system.

<2. Data>

Data used in the battery management system will be described next.

<2-1. Battery State Information>

Figure 3:
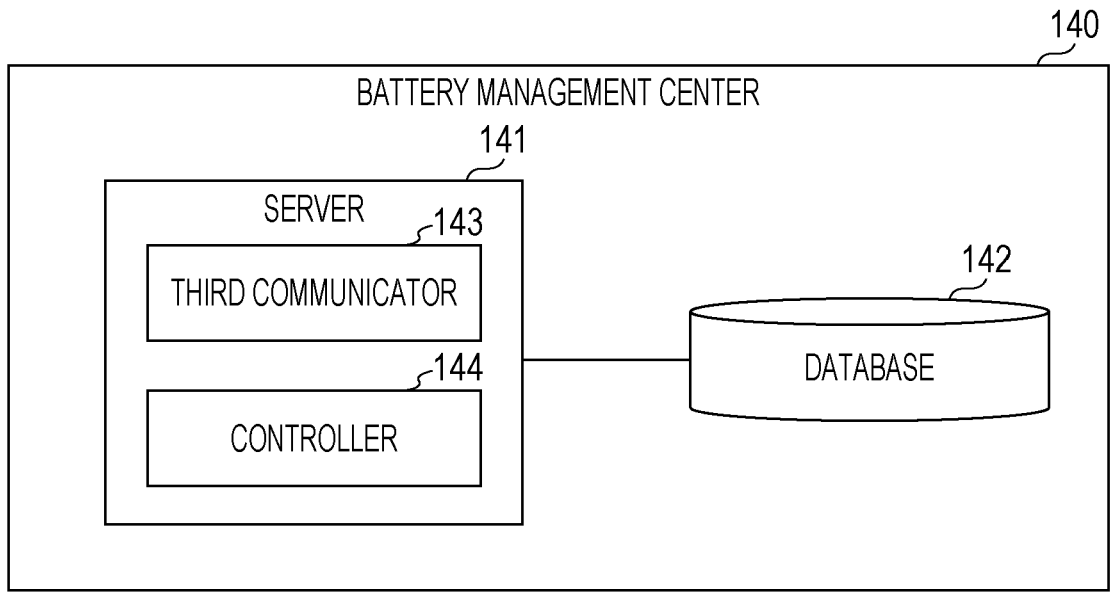
FIG. 3 illustrates one example of the data structure of battery state information.

FIG. 3 illustrates one example of the data structure of battery state information 300 stored in the storage unit 114 in the electrical-power storage device 110. As illustrated in FIG. 3, the battery state information 300 includes a battery identifier (ID), a remaining battery capacity, a charging count, a discharging count, the total amount of charge, the total amount of discharge, a battery voltage, a highest battery voltage value, a lowest battery voltage value, a battery temperature, a highest battery temperature value, a lowest battery temperature value, and an internal resistance. The battery ID is information for uniquely identifying the electrical-power storage device 110. The remaining battery capacity is the amount of dischargeable electric power presently accumulated in the storage battery 117. The charging count indicates the number of times the storage battery 117 executed charging in the past, and the discharging count indicates the number of times the storage battery 117 executed discharging in the past. The total amount of charge is the total amount of electric power charged in past charging, and the total amount of discharge is the total amount of electric power discharged in past discharging. The battery voltage indicates the present value of a voltage across a positive terminal and a negative terminal of the storage battery 117. The highest battery voltage value and the lowest battery voltage value indicate the largest value and the smallest value, respectively, of the battery voltage from the time of manufacture of the electrical-power storage device 110 until the present time. The battery temperature is the present value of the temperature of the storage battery 117. The highest battery temperature value and the lowest battery temperature value are the largest value and the smallest value, respectively, of the battery temperature from the time of manufacture of the electrical-power storage device 110 until the present time. The internal resistance is the present value of an internal resistance of the storage battery 117.

With respect to the state of the storage battery 117, the battery-state updater 113 sequentially measures the remaining battery capacity, the battery voltage, the battery temperature, and the internal resistance, and for each measurement, the battery-state updater 113 updates the battery state information 300 stored in the storage unit 114. Also, each time the storage battery 117 executes discharging, the discharging circuit 115 reports the amount of discharge to the controller 119, and the controller 119 increments the discharging count in the battery state information 300 stored in the storage unit 114 and adds the reported amount of discharge to the total amount of discharge. Each time the storage battery 117 executes charging, the charging circuit 116 reports the amount of charge to the controller 119, and the controller 119 increments the charging count in the battery state information 300 stored in the storage unit 114 and adds the reported amount of charge to the total amount of charge.

<2-2. Battery-Use History Information>

FIG. 4 illustrates one example of battery-use history information 400 stored in the storage unit 134 in the information terminal 130. The battery-use history information 400 is information in which a user ID, date and time, and a flag are associated with the battery state information 300 obtained from the electrical-power storage device 110 at a predetermined point in time. The user ID is information for uniquely identifying the information terminal 130 or a user of the information terminal 130. The date and time indicates the date and time when the corresponding battery state information 300 was obtained from the electrical-power storage device 110. The flag is a value indicating any of "started", "continued", and "ended". During transmission of the battery state information 300 to the information terminal 130, the electrical-power storage device 110 also transmits information indicating that the battery state information 300 is obtained at a start of the use of the electrical-power storage device 110, at a continuation of the use of the electrical-power storage device 110, or at an end of the use of the electrical-power storage device 110. On the basis of the obtained notification and battery state information, the information terminal 130 assigns, in the "flag" field in a corresponding record, a value indicating "started" when the battery state information 300 is obtained at a start of the use of the electrical-power storage device 110, a value indicating "continued" when the battery state information 300 is obtained at a continuation of the use of the electrical-power storage device 110, or a value indicating "ended" when the battery state information 300 is obtained at an end of the use of the electrical-power storage device 110.

Although only the value indicating the remaining battery capacity in the battery state information 300 in FIG. 3 is the value indicating the state of the storage battery 117 included in the battery state information in the battery-use history information 400 in FIG. 4, the value indicating the state of the storage battery 117 may be a value indicating another state or include values indicating a plurality of other states.

<2-3. Battery Management Information>

FIG. 5 illustrates one example of battery management information 500 stored in the database 142 in the battery management center 140.

The battery management information 500 is information obtained by accumulating the battery-use history information 400 that the third communicator 143 obtained from the information terminal 130 at a predetermined point in time. The battery management information 500 is accumulated information of the battery-use history information of all users who use the battery management system and is information for unified management of electrical-power storage devices used by the users.

The description thus far has been given of the data used in the battery management system.

<3. Operation>

Operations for processing executed in the battery management system will be described next.

<3-1. Battery-Management-Information Update Processing>

Figure 6:
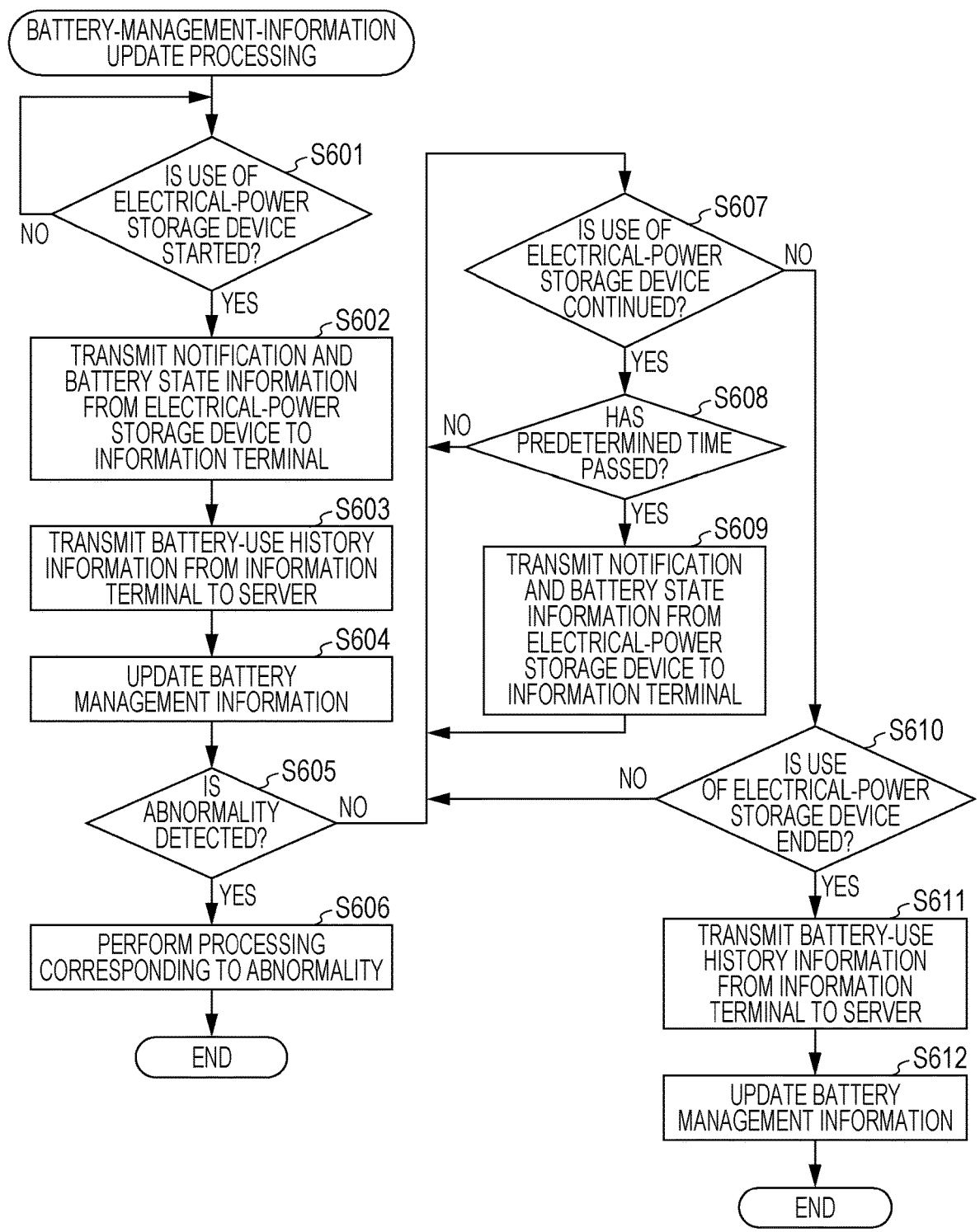
FIG. 6 is a flowchart illustrating one example of battery-management-information update processing.

FIG. 6 is a flowchart illustrating operations for battery-management-information update processing for updating the battery management information 500 stored in the database 142 in the battery management center 140.

In step S601, by performing use-start determination processing described below, the controller 119 in the electrical-power storage device 110 determines whether or not use of the electrical-power storage device 110 is started. If use of the electrical-power storage device 110 is started, the process proceeds to step S602, and if use of the electrical-power storage device 110 is not started, the controller 119 waits until use of the electrical-power storage device 110 is started.

In step S602, the controller 119 in the electrical-power storage device 110 transmits, to the information terminal 130 via the communicator 111, information indicating that the use of the electrical-power storage device 110 is started at this point in time and the battery state information 300 stored in the storage unit 114.

In step S603, the information terminal 130 generates battery-use history information 400 on the basis of these information received from the electrical-power storage device 110 and transmits the battery-use history information 400 to the server 141 in the battery management center 140.

In step S604, on the basis of the battery-use history information 400 received via the third communicator 143 in the server 141 in the battery management center 140, the controller 144 updates the battery management information 500 stored in the database 142.

In step S605, the controller 144 in the server 141 in the battery management center 140 performs abnormality detection processing (described below) to determine whether or not the electrical-power storage device 110 has an abnormality, and the server 141 reports the determination result to the information terminal 130. The determination result is further reported from the information terminal 130 to the electrical-power storage device 110. If the controller 144 detects an abnormality, the process proceeds to step S606, and if the controller 144 does not detect an abnormality, the process proceeds to step S607.

In step S606, the server 141 in the battery management center 140, the information terminal 130, and the electrical-power storage device 110 perform processing corresponding to the abnormality. One example of the processing corresponding to the abnormality is that the presenting means in the information terminal 130 presents, to the user, information indicating that an abnormality is detected in the electrical-power storage device 110 and the reporting means in the electrical-power storage device 110 reports that an abnormality is detected in the electrical-power storage device 110. In the information terminal 130, the presenting means may also present, to the user, information for prompting at least one of checking and replacing the electrical-power storage device 110.

In step S607, the controller 119 in the electrical-power storage device 110 performs use-continuation determination processing (described below) to determine whether or not the use of the electrical-power storage device 110 is continued. If the use of the electrical-power storage device 110 is continued, the process proceeds to step S608, and if the use of the electrical-power storage device 110 is not continued, the process proceeds to step S610.

In step S608, the controller 119 in the electrical-power storage device 110 determines whether or not a predetermined time (e.g., 10 minutes) has passed from the last time the battery state information 300 was transmitted to the information terminal 130. If the predetermined time has passed, the process proceeds to step S609, and if the predetermined time has not passed, the process returns to step S607.

In step S609, the controller 119 in the electrical-power storage device 110 transmits, to the information terminal 130 via the communicator 111, information indicating that the use of the electrical-power storage device 110 is continued and the battery state information 300 stored in the storage unit 114. The information terminal 130 receives these information from the electrical-power storage device 110 via the first communicator 131, generates battery-use history information 400 on the basis of the received information, and stores the generated battery-use history information 400 in the storage unit 134.

In step S610, the controller 119 in the electrical-power storage device 110 performs use-end determination processing (described below) to determine whether or not the use of the electrical-power storage device 110 is ended at this point in time. If the use of the electrical-power storage device 110 is ended at this point in time, the controller 119 in the electrical-power storage device 110 transmits, to the information terminal 130 via the communicator 111, information indicating that the use of the electrical-power storage device 110 is ended at this point in time. Thereafter, the process proceeds to step S611. If the use of the electrical-power storage device 110 is not ended, the process returns to step S607.

In step S611, the information terminal 130 assigns "ended" to the "flag" field in a most recent record in the battery-use history information 400 accumulated in the storage unit 134 and then transmits the battery-use history information 400 to the server 141 in the battery management center 140 via the second communicator 132.

In step S612, on the basis of the battery-use history information 400 received via the third communicator 143 in the server 141 in the battery management center 140, the controller 144 updates the battery management information 500 stored in the database 142.

Figure 7:
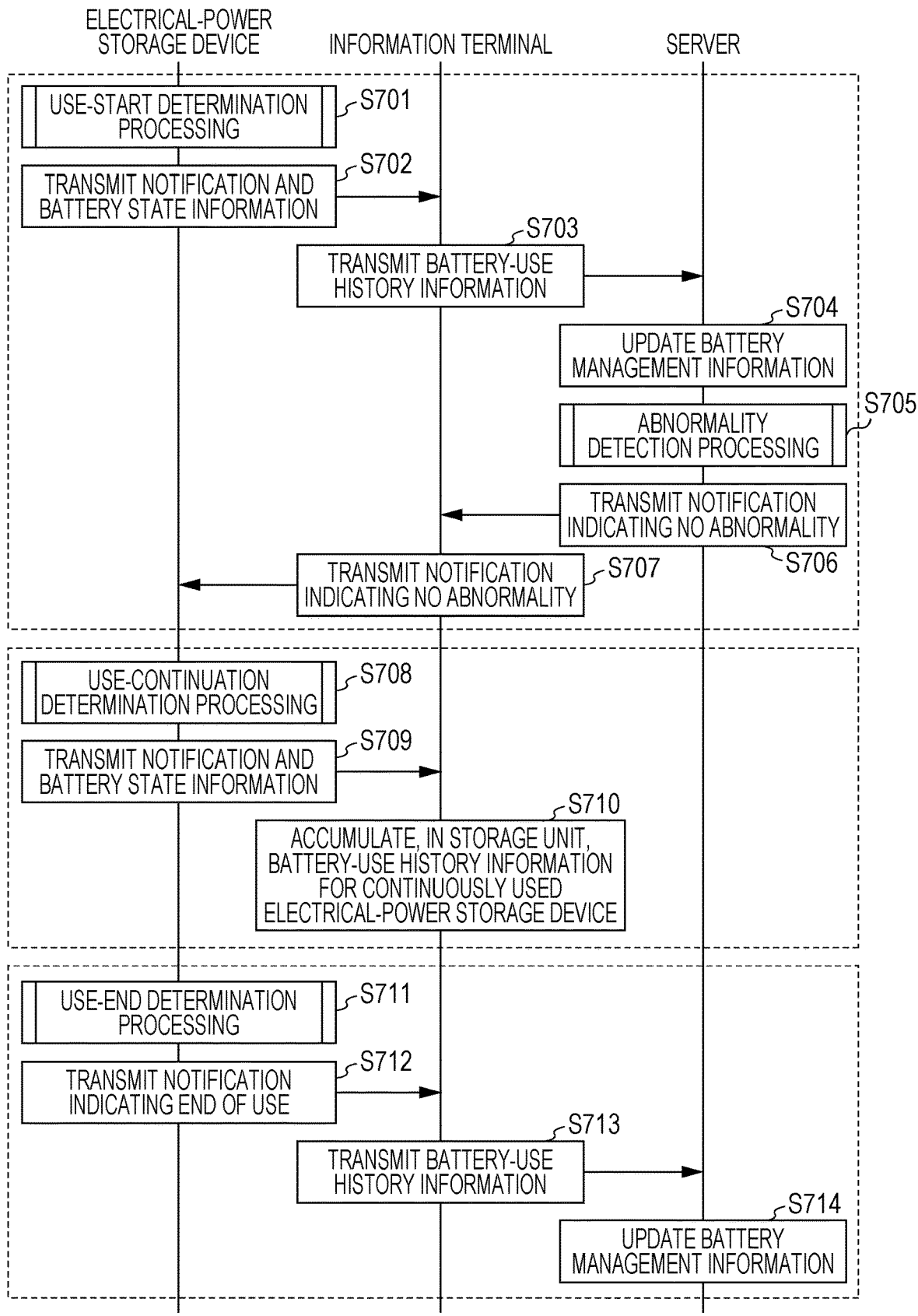
FIG. 7 is a sequence diagram illustrating one example of the battery-management-information update processing.

FIG. 7 is a sequence diagram illustrating a flow of data communication when the battery management information is updated in the battery-management-information update processing illustrated in FIG. 6 without detection of an abnormality in the electrical-power storage device.

In step S701, the controller 119 in the electrical-power storage device 110 performs use-start determination processing (described below) to detect that the use of the electrical-power storage device 110 is started. In step S702, the controller 119 in the electrical-power storage device 110 transmits, to the information terminal 130 via the communicator 111, information indicating that the use of the electrical-power storage device 110 is started at this point in time and the battery state information 300 stored in the storage unit 114. In step S703, the controller 135 in the information terminal 130 generates battery-use history information 400 on the basis of these information received from the electrical-power storage device 110 and transmits the generated battery-use history information 400 to the server 141 in the battery management center 140 via the second communicator 132. In step S704, on the basis of the battery-use history information 400 received via the third communicator 143 in the server 141 in the battery management center 140, the controller 144 updates the battery management information 500 stored in the database 142.

In step S705, the controller 144 in the server 141 in the battery management center 140 performs abnormality detection processing (described below) to detect that the electrical-power storage device 110 has no abnormality. In step S706, the controller 144 in the server 141 in the battery management center 140 transmits, to the information terminal 130 via the third communicator 143, a notification indicating that no abnormality was detected in the electrical-power storage device 110. In step S707, the controller 135 in the information terminal 130 transmits, to the electrical-power storage device 110 via the first communicator 131, a notification indicating that no abnormality was detected in the electrical-power storage device 110.

In step S708, the controller 119 in the electrical-power storage device 110 performs use-continuation determination processing (described below) to detect that the use of the electrical-power storage device 110 is continued. In step S709, the controller 119 in the electrical-power storage device 110 transmits, to the information terminal 130, information indicating that the use of the electrical-power storage device 110 is continued and the battery state information 300 stored in the storage unit 114. In step S710, the information terminal 130 generates battery-use history information 400 on the basis of these information received from the electrical-power storage device 110 and accumulates the generated battery-use history information 400 in the storage unit 134. Individual steps S708 to S710 are repeatedly executed at predetermined time intervals until the controller 119 in the electrical-power storage device 110 detects the end of the use.

In step S711, the controller 119 in the electrical-power storage device 110 performs use-end determination processing (described below) to detect that the use of the electrical-power storage device 110 is ended. In step S712, the controller 119 in the electrical-power storage device 110 transmits, to the information terminal 130, information indicating that the use of the electrical-power storage device 110 is ended at this point in time. In step S713, the information terminal 130 assigns "ended" to the "flag" field in a most recent record in the battery-use history information 400 accumulated in the storage unit 134 and then transmits the battery-use history information 400 to the server 141 in the battery management center 140. In step S714, on the basis of the received battery-use history information 400, the server 141 in the battery management center 140 updates the battery management information 500 stored in the database 142.

The battery management information 500 stored in the database 142 in the battery management center 140 is updated, as described above and illustrated in FIGS. 6 and 7.

<3-2. Use-Start, Use-Continuation, and Use-End Determination Processing>

FIGS. 8A and 8B are flowcharts illustrating operations for the use-start determination processing, the use-continuation determination processing, and the use-end determination processing executed by the electrical-power storage device 110.

First, a description will be given of the use-start determination processing and the use-continuation determination processing illustrated in FIG. 8A.

In step S801, the controller 119 in the electrical-power storage device 110 obtains the state of the switch 121 of the electric bicycle 120 via the communication terminal in the terminal unit 118. If the switch 121 is on, the process proceeds to step S802, and if the switch 121 is off, the process proceeds to step S805.

In step S802, the controller 119 in the electrical-power storage device 110 determines whether or not electrical power is supplied from the storage battery 117 to the load 123 of the electric bicycle 120. If electrical power is supplied, the process proceeds to step S803, and if electrical power is not supplied, the process proceeds to step S805.

In step S803, on the basis of an output of the movement detector 112, the controller 119 in the electrical-power storage device 110 determines whether or not the electrical-power storage device 110 is moving. If the electrical-power storage device 110 is moving, the process proceeds to step S804, and if the electrical-power storage device 110 is not moving, the process proceeds to step S805.

In step S804, the controller 119 in the electrical-power storage device 110 determines that the use of the electrical-power storage device 110 is started at this point in time or the use of the electrical-power storage device 110 is continued.

In step S805, the controller 119 in the electrical-power storage device 110 determines that the use of the electrical-power storage device 110 is neither started at this point in time nor continued.

The electrical-power storage device 110 executes the use-start determination processing and the use-continuation determination processing in the manner described above. Next, the use-end determination processing will be described with reference to FIG. 8B.

In step S811, the controller 119 in the electrical-power storage device 110 obtains the state of the switch 121 of the electric bicycle 120 via the communication terminal in the terminal unit 118. If the state of the switch 121 is off, the process proceeds to step S812, and if the state of the switch 121 is on, the process proceeds to step S815.

In step S812, the controller 119 in the electrical-power storage device 110 determines whether or not electrical power is supplied from the storage battery 117 to the load 123 of the electric bicycle 120. If electrical power is not supplied, the process proceeds to step S813, and if electrical power is supplied, the process proceeds to step S815.

In step S813, on the basis of an output of the movement detector 112, the controller 119 in the electrical-power storage device 110 determines whether or not the electrical-power storage device 110 is moving. If the electrical-power storage device 110 is not moving, the process proceeds to step S814, and if the electrical-power storage device 110 is moving, the process proceeds to step S815.

In step S814, the controller 119 in the electrical-power storage device 110 determines that the use of the electrical-power storage device 110 is ended at this point in time.

In step S815, the controller 119 in the electrical-power storage device 110 determines that the use of the electrical-power storage device 110 is not ended at this point in time.

The electrical-power storage device 110 executes the use-end determination processing in the manner described above.

<3-3. Abnormality Detection Processing>

A description will be given of the abnormality detection processing executed by the electrical-power storage device 110. FIG. 9 is a flowchart illustrating the abnormality detection processing executed by the server 141 in the battery management center 140.

In step S901, the controller 144 in the server 141 in the battery management center 140 obtains, via the third communicator 143, a value indicating the state of the electrical-power storage device 110 at the end of the use. More specifically, the controller 144 in the server 141 extracts, from the battery management information 500 stored in the database 142, the most recent record of records in which the value in the "battery ID" field matches a specified battery ID and in which the "flag" field indicates "ended", and obtains, as the value indicating the state of the electrical-power storage device 110 at the end of the use, the value in the field of the value indicating the state of the electrical-power storage device 110 in the extracted record.

In step S902, the controller 144 in the server 141 in the battery management center 140 obtains a value indicating the state of the electrical-power storage device 110 at the start of the use. More specifically, the controller 144 in the server 141 extracts, from the battery management information 500 stored in the database 142, the most recent record of records in which the value in the "battery ID" field matches a specified battery ID and in which the "flag" field indicates "started", and obtains, as the value indicating the state of the electrical-power storage device 110 at the start of the use, the value in the field of the value indicating the state of the electrical-power storage device 110 in the extracted record.

In step S903, the controller 144 in the server 141 in the battery management center 140 calculates a difference between the value indicating the state of the electrical-power storage device 110 at the end of the use and the value indicating the state of the electrical-power storage device 110 at the start of the use and determines whether or not the difference resulting from the calculation is larger than or equal to a threshold. If the difference is larger than or equal to the threshold, the process proceeds to step S904, and if the difference is smaller than the threshold, the process proceeds to step S905.

In step S904, the controller 144 in the server 141 in the battery management center 140 determines that the storage battery 117 with the specified battery ID has an abnormality.

In step S905, the controller 144 in the server 141 in the battery management center 140 determines that the storage battery 17 with the specified battery ID has no abnormality.

For instance, it is assumed that, in a case in which the battery management information 500 stored in the database 142 has the information in the example illustrated in FIG. 5, the specified battery ID is "14194", the value indicating the state of the electrical-power storage device 110 is the "remaining battery capacity", and the threshold is "1000", In this case, in step S901, the value indicating the state of the electrical-power storage device 110 at the end of the use is 6500, and in step S902, the value indicating the state of the electrical-power storage device 110 at the start of the use is 6200. In step S903, the difference between the value indicating the state of the electrical-power storage device 110 at the end of the use and the value indicating the state of the electrical-power storage device 110 at the start of the use is 300, which is smaller than the threshold "1000", and thus the process proceeds to step S905. In step S905, it is determined that the electrical-power storage device 110 with the battery ID "14194" has no abnormality.

Also, it is assumed that, in a case in which the battery management information 500 stored in the database 142 has the information in the example illustrated in FIG. 5, the specified battery ID is "48317", and the value indicating the state of the electrical-power storage device 110 is the "remaining battery capacity", and the threshold is "1000". In this case, in step S901, the value indicating the state of the electrical-power storage device 110 at the end of the use is 7500, and in step S902, the value indicating the state of the electrical-power storage device 110 at the start of the use is 1500. In step S903, the difference between the value indicating the state of the electrical-power storage device 110 at the end of the use and the value indicating the state of the electrical-power storage device 110 at the start of the use is 6000, which is larger than or equal to the threshold "1000", and thus the process proceeds to step S904. In S904, it is determined that the electrical-power storage device 110 with the battery ID "48317" has an abnormality.

The description thus far has been given of the abnormality detection processing.

When the electrical-power storage device is operating properly, a change in the value indicating the state of the electrical-power storage device in a use stop period from when the use of the electrical-power storage device is ended until the use thereof is started is limiting. For example, even in the use stop period, the remaining battery capacity of the electrical-power storage device decreases through self-discharge, but the amount of decrease in a short period of time is very small. Accordingly, when the amount of decrease in the remaining battery capacity in the use stop period of the electrical-power storage device is large to a degree that cannot be thought to be due to self-discharge, it can be thought that the electrical-power storage device has an abnormality. Similarly to the value indicating the remaining battery capacity, changes in other values indicating the state of the electrical-power storage device in the use stop period are also limiting. In the battery management system in the present embodiment, when a change in the value indicating the state of the electrical-power storage device in a use stop period is unthinkably large, this change is detected as an abnormality in the electrical-power storage device.

<4. Modifications>

While the battery management system according to the present disclosure has been described above based on the particular embodiment, modifications can also be made as described below, and the present disclosure is not limited to the battery management system described above in the embodiment.

Figure 10A:
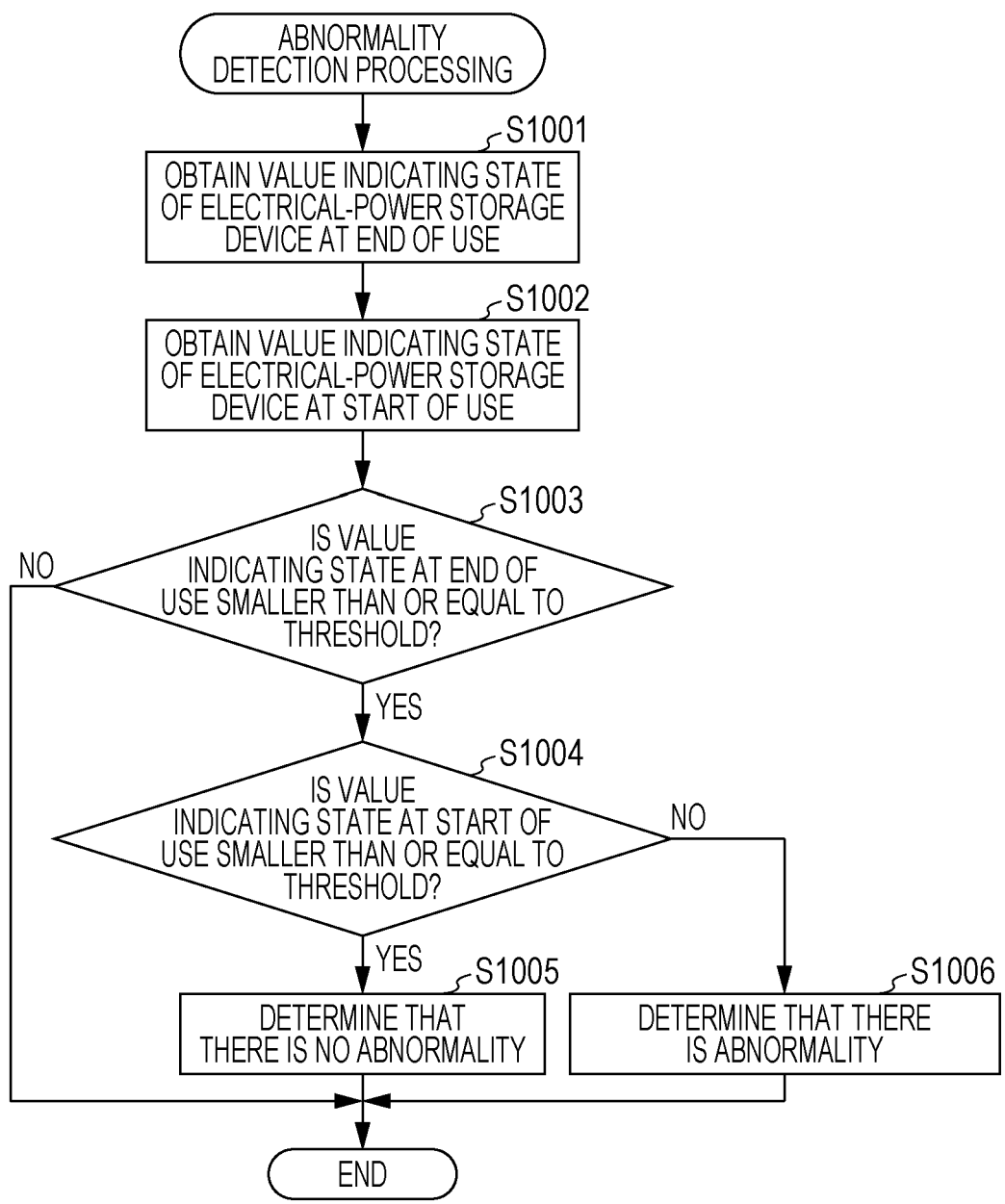

(1) FIG. 10A is a flowchart illustrating a modification of the abnormality detection processing illustrated in FIG. 9.

Steps S1001 and S1002 are the same as or similar to steps S901 and S902 illustrated in FIG. 9.

In step S1003, the controller 144 in the server 141 in the battery management center 140 determines whether or not the value indicating the state of the electrical-power storage device 110 at the end of the use, the value being obtained in step S1001, is smaller than or equal to a first threshold. If the value is larger than the first threshold, the flow ends, and if the value is smaller than or equal to the first threshold, the process proceeds to step S1004.

In step S1004, the controller 144 in the server 141 in the battery management center 140 determines whether or not the value indicating the state of the electrical-power storage device 110 at the start of the use, the value being obtained in step S1002, is smaller than or equal to the first threshold. If the value is larger than the first threshold, the process proceeds to step S1006, and if the value is smaller than or equal to the first threshold, the process proceeds to step S1005.

In step S1005, the controller 144 in the server 141 in the battery management center 140 determines that the storage battery 117 with the specified battery ID has no abnormality.

In step S1006, the controller 144 in the server 141 in the battery management center 140 determines that the storage battery 17 with the specified battery ID has an abnormality.

When the storage battery 117 is operating properly, the value indicating the state of the electrical-power storage device 110 does not depart from a predetermined range. Accordingly, determining whether or not each of the value indicating the state of the electrical-power storage device 110 at the start of the use and the value indicating the state of the electrical-power storage device 110 at the end of the use departs from a threshold range makes it possible to detect an abnormality in the electrical-power storage device 110 in a use stop period. In the flow described above and illustrated in FIG. 10A, an abnormality is detected based on whether or not each of the values indicating the state of the electrical-power storage device 110 at the start of the use and at the end of the use is smaller than or equal to the first threshold, which is an upper limit.

Specifically, for example, it is assumed that even though the highest battery temperature value at the end of the use is smaller than or equal to the first threshold, a temperature higher than the first threshold is recorded as the highest battery temperature value at the start of the use.

In this case, this is thought to be due to abnormal heat generation of the electrical-power storage device 110 or storage of the electrical-power storage device 110 under high temperature in a use stop period. An abnormality in the electrical-power storage device 110 in such a use stop period is detected in the abnormality detection method in this modification. The value indicating the state of the electrical-power storage device 110 is not limited to the highest battery temperature value and may be the highest battery voltage value.

In addition, although a determination as to whether or not the value indicating the state of the electrical-power storage device 110 is smaller than or equal to the first threshold, which is the upper limit, is made in each of steps S1003 and S1004 described above, naturally, a determination may also be made as to whether or not a value indicating the state of the storage battery 7 is larger than or equal to a second threshold, which is a lower limit. In such a case, specifically, for example, an abnormality may be detected through comparison of the lowest battery temperature value with the second threshold. Also, an abnormality may be detected through comparison of the lowest battery voltage value with the second threshold.

(2) FIG. 10B is a flowchart illustrating a modification of the abnormality detection processing illustrated in FIG. 9, the modification being different from that in FIG. 10A.

In step S1011, the controller 144 in the server 141 in the battery management center 140 obtains values indicating two types of state of the electrical-power storage device 110 at the end of the use. The server 141 in the battery management center 140 obtains, for example, the charging count and the remaining battery capacity of the electrical-power storage device 110 at the end of the use.

In step S1012, the controller 144 in the server 141 in the battery management center 140 obtains values indicating two types of state of the electrical-power storage device 110 at the start of the use. The controller 144 in the server 141 in the battery management center 140 obtains, for example, the charging count and the remaining battery capacity of the electrical-power storage device 110 at the start of the use.

In step S1013, with respect to the values indicating one of the two types of state, the values being obtained in steps S1011 and S1012, the controller 144 in the server 141 in the battery management center 140 determines whether or not a change from the end of the use to the start of the use satisfies a predetermined condition. For example, the controller 144 determines whether or not the value of the remaining battery capacity has increased from the value at the end of the use. If the condition is satisfied, the process proceeds to step S1014, and if the condition is not satisfied, the process proceeds to step S1016.

In step S1014, with respect to the values indicating the other of the two types of state, the values being obtained in steps S1011 and S1012, the controller 144 in the server 141 in the battery management center 140 determines whether or not a change from the end of the use to the start of the use satisfies a predetermined condition. For example, the controller 144 determines whether or not the value of the charging count exhibits no increase from the end of the use. If the condition is satisfied, the process proceeds to step S1015, and if the condition is satisfied, the process proceeds to step S1016.

In step S1015, the controller 144 in the server 141 in the battery management center 140 determines that the storage battery 117 with the specified battery ID has an abnormality.

In step S1016, the controller 144 in the server 141 in the battery management center 140 determines that the storage battery 17 with the specified battery ID has no abnormality.

Although, in the above-described example, determinations as to whether or not two conditions are satisfied are made with respect to the values indicating the two types of state, whether or not more conditions are satisfied may also be determined with respect to values indicating more types of state.

According to this abnormality detection method, for example, an event in which the remaining battery capacity increases even though an increase in the charging count is not recorded in the electrical-power storage device can be detected as an abnormality in the electrical-power storage device.

(3) The threshold(s) in the above-described abnormality detection processing may be determined according to the length of the use stop period from the end of the use until the start of the use. For example, since the remaining battery capacity decreases through self-discharge as the use stop period increases, the threshold(s) may be increased as the use stop period increases.

(4) The threshold(s) in the above-described abnormality detection processing may be determined based on location information of the electrical-power storage device 110 at the end of the use and/or at the start of the use. The location information of the electrical-power storage device 110 at the end of the use or at the start of the use is thought to indicate the storage location of the electrical-power storage device 110. For example, since the amount of self-discharge increases as the storage temperature of the electrical-power storage device 110 increases, the threshold(s) may also be increased when the electrical-power storage device 110 is thought to be stored in/at a warm place, on the basis of the location information of the electrical-power storage device 110. The electrical-power storage device 110 may have a global positioning system (GPS) receiver to obtain the location information of the electrical-power storage device 110 and may transmit the location information, together with the battery state information 300, to the information terminal 130. Also, the information terminal 130 may have a GPS receiver and may use, as the location information of the electrical-power storage device 110, location information when the battery state information 300 is received from the electrical-power storage device 110.

(5) Although, in the above-described embodiment, the highest battery temperature value and the lowest battery temperature value are the largest value and the smallest value, respectively, of the battery temperature from the time of manufacture of the electrical-power storage device 110 until the present time, the highest battery temperature value and the lowest battery temperature value may be the largest value and the smallest value, respectively, of the battery temperature from when the electrical-power storage device 110 detects the end of the use through use-end processing until it detects the start of the use through use-start processing. In addition, although the highest battery voltage value and the lowest battery voltage value are the largest value and the smallest value, respectively, of the battery voltage from the time of manufacture of the electrical-power storage device 110 until the present time, the highest battery voltage value and the lowest battery voltage value may also be the largest value and the smallest value, respectively, of the battery voltage from when the electrical-power storage device 110 detects the end of the use through use-end processing until it detects the start of the use through use-start processing.

(6) Although, in the above-described embodiment, the electrical-power storage device 110 determines the start of the use and the end of the use of the electrical-power storage device 110, the information terminal 130 may determine the start of the use and the end of the use of the electrical-power storage device 110. For example, the information terminal 130 may determine that the use of electrical-power storage device 110 is started when the information terminal 130 and the electrical-power storage device 110 are connected to each other through a short-range wireless communication and may determine that the use of the electrical-power storage device 110 is ended when the connection between the information terminal 130 and the electrical-power storage device 110 is broken.

(7) Although, in the above-described embodiment, the electric equipment having the electrical-power storage device 110 has been described as being an electric bicycle, the electric equipment is not limited thereto and may be any electric equipment that uses an electrical-power storage device as a power source.

<5. Supplement>

A description will be further given of the configuration in the present disclosure.

(1) An abnormality detection method in a first aspect of the present disclosure is directed to an abnormality detection method. The method includes: obtaining, via an information terminal wirelessly connected to an electrical-power storage device, a value indicating a state of the electrical-power storage device at an end of use of electric equipment having the electrical-power storage device; obtaining, via the information terminal, a value indicating the state of the electrical-power storage device at a start of the use of the electric equipment; and detecting an abnormality in the electrical-power storage device by using the value indicating the state of the electrical-power storage device at the end of the use and the value indicating the state of the electrical-power storage device at the start of the use.

(2) An abnormality detection method in a second aspect of the present disclosure has, in the abnormality detection method of the first aspect described above, a characteristic in that, in the detecting of the abnormality, when a change from the value indicating the state of the electrical-power storage device at the end of the use to the value indicating the state of the electrical-power storage device at the start of the use, the change being calculated using the value indicating the state of the electrical-power storage device at the end of the use and the value indicating the state of the electrical-power storage device at the start of the use, is larger than or equal to a threshold, it is determined that the electrical-power storage device has the abnormality.

(3) An abnormality detection method in a third aspect of the present disclosure has, in the abnormality detection method in the second aspect described above, a characteristic in that each value indicating the state of the electrical-power storage device is at least one of a remaining battery capacity, a battery voltage, a charging count, a discharging count, a total amount of charge, a total amount of discharge, and an internal resistance.

(4) An abnormality detection method in a fourth aspect of the present disclosure has, in the abnormality detection method of the first aspect described above, a characteristic in that, in the detecting of the abnormality, when the value indicating the state of the electrical-power storage device at the end of the use is smaller than or equal to a first threshold, and the value indicating the state of the electrical-power storage device at the start of the use is larger than the first threshold, it is determined that the electrical-power storage device has the abnormality.

(5) An abnormality detection method in a fifth aspect of the present disclosure has, in the abnormality detection method in the fourth aspect described above, a characteristic in that each value indicating the state of the electrical-power storage device is at least one of a highest battery temperature value and a highest battery voltage value.

(6) An abnormality detection method in a sixth aspect of the present disclosure has, in the abnormality detection method in the first aspect described above, a characteristic in that, in the detecting of the abnormality, when the value indicating the state of the electrical-power storage device at the end of the use is larger than or equal to a second threshold, and the value indicating the state of the electrical-power storage device at the start of the use is smaller than the second threshold, it is determined that the electrical-power storage device has the abnormality.

(7) An abnormality detection method in a seventh aspect of the present disclosure has, in the abnormality detection method in the sixth aspect described above, a characteristic in that each value indicating the state of the electrical-power storage device is at least one of a lowest battery temperature value and a lowest battery voltage value.

(8) A server apparatus in an eighth aspect of the present disclosure includes: an obtainer that obtains, via an information terminal wirelessly connected to an electrical-power storage device, a value indicating a state of the electrical-power storage device at an end of use of electric equipment having the electrical-power storage device and that obtains, via the information terminal, a value indicating the state of the electrical-power storage device at a start of the use of the electric equipment; and an abnormality detector that detects an abnormality in the electrical-power storage device by using the value indicating the state of the electrical-power storage device at the end of the use and the value indicating the state of the electrical-power storage device at the start of the use, the values being obtained by the obtainer.

The present disclosure makes it possible to detect an abnormality in an electrical-power storage device in a use stop period and is useful as a method for managing the electrical-power storage device.

What is claimed is:

1. An abnormality detection method for detecting an abnormality in an electrical-power storage device including a storage battery, the electrical-power storage device being connected to power an electric equipment via a discharging terminal pair, the method comprising:
    obtaining, via an information terminal wirelessly connected to the electrical-power storage device, a value indicating a state of the electrical-power storage device at an end of a previous use of the electric equipment;
    obtaining, via the information terminal, a value indicating a state of the electrical-power storage device at a start of current use of the electric equipment; and
    detecting that the abnormality occurred in the electrical-power storage device during a use stop period, based on a difference in the value indicating the state of the electrical-power storage device at the end of the previous use and the value indicating the state of the electrical-power storage device at the start of the current use,
    wherein the use stop period is a period from the end of the previous use of the electric equipment until the start of the current use of the electric equipment, and
    wherein each of the start of the current use and the end of the previous use is determined based on a detection of movement of the electrical-power storage device, which is separate from a detection of power supply.

2. The abnormality detection method according to claim 1,
    wherein, in the detecting of the abnormality, when a change from the value indicating the state of the electrical-power storage device at the end of the previous use to the value indicating the state of the electrical-power storage device at the start of the current use, the change being calculated using the value indicating the state of the electrical-power storage device at the end of the previous use and the value indicating the state of the electrical-power storage device at the start of the current use, is larger than or equal to a threshold, it is determined that the electrical-power storage device has the abnormality.

3. The abnormality detection method according to claim 1,
    wherein, in the detecting of the abnormality, when the value indicating the state of the electrical-power storage device at the end of the previous use is smaller than or equal to a first threshold, and the value indicating the state of the electrical-power storage device at the start of the current use is larger than the first threshold, it is determined that the electrical-power storage device has the abnormality.

4. The abnormality detection method according to claim 3,
    wherein each value indicating the state of the electrical-power storage device is at least one of a highest battery temperature value and a highest battery voltage value.

5. The abnormality detection method according to claim 1,
    wherein, in the detecting of the abnormality, when the value indicating the state of the electrical-power storage device at the end of the previous use is larger than or equal to a second threshold, and the value indicating the state of the electrical-power storage device at the start of the current use is smaller than the second threshold, it is determined that the electrical-power storage device has the abnormality.

6. The abnormality detection method according to claim 5,
    wherein each value indicating the state of the electrical-power storage device is at least one of a lowest battery temperature value and a lowest battery voltage value.

7. The abnormality detection method according to claim 1, wherein the state of the electrical-power storage device refers to a remaining battery capacity.

8. The abnormality detection method according to claim 1, further comprising:
    presenting, to a user, information indicating that the abnormality is detected in the electrical-power storage device.

9. The abnormality detection method according to claim 1, further comprising:
    transmitting, by the electrical-power storage device, the state of the electrical-power storage device to the informational terminal at certain use periods.

10. The abnormality detection method according to claim 1,
    wherein the value indicating the state of the electrical-power storage device is at least one of a remaining battery capacity, a battery voltage, a charging count, a discharging count, a total amount of charge, a total amount of discharge, and an internal resistance.

11. A system, comprising:

an electrical-power storage device including a storage battery, the electrical-power storage device configured to connect to an electric equipment and power the electric equipment via a discharging terminal pair;

an obtainer that obtains, via an information terminal wirelessly connected to the electrical-power storage device, a value indicating a state of the electrical-power storage device at an end of a previous use of the electric equipment, and obtains, via the information terminal, a value indicating a state of the electrical-power storage device at a start of current use of the electric equipment; and an abnormality detector that detects an abnormality that occurred in the electrical-power storage device during a use stop period, based on a difference in the value indicating the state of the electrical-power storage device at the end of the previous use and the value indicating the state of the electrical-power storage device at the start of the current use, wherein the value indicating the state of the electrical-power storage device at the end of the previous use and the value indicating the state of the electrical-power storage device at the start of the current use are obtained by the obtainer, and wherein the use stop period is a period from the end of the previous use of the electric equipment until the start of the current use of the electric equipment, and wherein each of the start of the current use and the end of the previous use is determined based on a detection of movement of the electrical-power storage device, which is separate from a detection of power supply.

12. The system according to claim 11, wherein the value indicating the state of the electrical-power storage device is at least one of a remaining battery capacity, a battery voltage, a charging count, a discharging count, a total amount of charge, a total amount of discharge, and an internal resistance.

* * * * *